United States Patent [19]

Caravello et al.

[11] Patent Number: 5,705,929
[45] Date of Patent: Jan. 6, 1998

[54] BATTERY CAPACITY MONITORING SYSTEM

[75] Inventors: Ronald G. Caravello, Boca Raton; David M. Tinker, Delray Beach; Roger D. Rognas, Pompano Beach, all of Fla.

[73] Assignee: Fibercorp. Inc., N. Lauderdale, Fla.

[21] Appl. No.: 448,195

[22] Filed: May 23, 1995

[51] Int. Cl.$^6$ .................................................. G01N 27/416
[52] U.S. Cl. ........................................... 324/430; 324/434
[58] Field of Search .................................. 324/430, 434, 324/433, 429; 320/48, 15–17; 340/636

[56] References Cited

U.S. PATENT DOCUMENTS

| | | | |
|---|---|---|---|
| 3,808,522 | 4/1974 | Sharaf | 320/48 |
| 4,060,666 | 11/1977 | Anes | 429/91 |
| 4,151,454 | 4/1979 | Iida | 320/48 |
| 4,275,351 | 6/1981 | Härer et al. | 324/427 |
| 4,295,097 | 10/1981 | Thompson et al. | 324/429 |
| 4,333,149 | 6/1982 | Taylor et al. | 324/433 |
| 4,413,221 | 11/1983 | Benjamin | 320/48 |
| 4,590,430 | 5/1986 | Vandenberghe et al. | 324/427 |

(List continued on next page.)

FOREIGN PATENT DOCUMENTS

| | | | |
|---|---|---|---|
| 4047282 | 2/1992 | Japan | 324/434 |
| 2262401 | 6/1993 | United Kingdom | 320/48 |
| 2269019 | 1/1994 | United Kingdom | 324/430 |
| 9322666 | 11/1993 | WIPO | 324/430 |

OTHER PUBLICATIONS

"Analysis and Interpretation of Conductance Measurements Used to Assess the State-Of-Health of Valve Regulated Lead Acid Batteries: Part III: Analytical Techniques" D.O. Feder and M.J. Hlavac; Presented at Intelec 94 (Oct. 30, 1994–Nov. 2, 1994).

"Conductance Testing Question and Answers"; Midtronics, Feb. 1993.

"Field and Laboratory Studies to Assess the State-of-Health of Valve-Regulated Lead Acid and Other Battery Technologies: Using Conductance Testing: Part II: Futher Conductance/Capacity Correlation Studies" M.J. Hlavac, D.O. Feder, T.G. Croda, and K.M. Champlin; Presented at Intelec 93 (Sep. 27, 1993–Sep. 30, 1993).

"Field & Laboratory Studies to Assess the State of Health of Valve-Regulated Lead Acid Batteries: Part I Conductance/Capacity Correlation Studies", D.O. Feder, T.G. Croda, K.M. Champlin and M.J. Hlavac; Intelec 92 (Oct. 4, 1992–Oct. 8, 1992).

"IEEE Recommended Practice for Maintenance, Testing and Replacement of Valve Regulated Lead–Acid Batteries for Stationary Applications"; PAR #1186, American National Standard, Apr. 4, 1994.

"Predicting Battery Performance Using Internal Cell Resistance"; G. Alber, AlbérCorp., Jan. 1995.

Primary Examiner—Sandra L. O'Shea
Assistant Examiner—Raymond Y. Mah
Attorney, Agent, or Firm—McHale & Slavin, P.A.

[57] ABSTRACT

A method of and apparatus for centrally monitoring the capacity of batteries in a battery string includes electrical leads connected to each battery terminal of the battery string. A capacity testing system a) switches between the electrical leads for sequentially selecting the leads associated with the terminals of each battery, b) measures the internal resistance of the battery associated with each selected pair of electrical leads, c) compares the internal resistance of each battery cell to an internal resistance threshold, and d) triggers an alarm when the internal resistance of a battery exceeds the internal resistance threshold. A central monitoring station monitors battery capacity data and alarm signals from various battery strings, schedules battery capacity testing, transmits control commands to each capacity testing system for i) scheduling testing, ii) initializing upload of capacity data, and iii) requesting status information, provides battery capacity data analysis, and uploads information to a network management computer. The system is especially suitable for centrally monitoring the capacity of batteries located remote from the central station, preferably in external telecommunications housings and telecommunications power rooms.

32 Claims, 9 Drawing Sheets

U.S. PATENT DOCUMENTS

| | | | |
|---|---|---|---|
| 4,626,765 | 12/1986 | Tanaka | 320/48 |
| 4,697,134 | 9/1987 | Burkum et al. | 320/48 |
| 4,849,700 | 7/1989 | Morioka et al. | 324/427 |
| 4,916,438 | 4/1990 | Collins et al. | 324/430 |
| 4,918,368 | 4/1990 | Baker et al. | 320/40 |
| 4,931,737 | 6/1990 | Hishiki | 324/431 |
| 4,937,528 | 6/1990 | Palanisamy | 324/430 |
| 4,968,942 | 11/1990 | Palanisamy | 324/430 |
| 5,032,825 | 7/1991 | Kuznicki | 340/636 |
| 5,047,722 | 9/1991 | Wurst et al. | 324/430 |
| 5,122,751 | 6/1992 | Aita et al. | 324/429 |
| 5,124,627 | 6/1992 | Okada | 320/44 |
| 5,126,675 | 6/1992 | Yang | 324/435 |
| 5,140,269 | 8/1992 | Champlin | 324/433 |
| 5,148,043 | 9/1992 | Hirata et al. | 307/66 |
| 5,166,623 | 11/1992 | Ganio | 324/427 |
| 5,170,124 | 12/1992 | Blair et al. | 324/434 |
| 5,182,583 | 1/1993 | Horigome et al. | 324/429 |
| 5,184,059 | 2/1993 | Patino et al. | 320/15 |
| 5,227,259 | 7/1993 | Weaver et al. | 324/434 |
| 5,268,845 | 12/1993 | Startup et al. | 340/636 |
| 5,281,919 | 1/1994 | Palanisamy | 324/427 |
| 5,281,920 | 1/1994 | Wurst | 324/430 |
| 5,284,719 | 2/1994 | Landau et al. | 429/50 |
| 5,287,286 | 2/1994 | Ninomiya | 320/48 |
| 5,304,433 | 4/1994 | Cherng | 429/91 |
| 5,341,084 | 8/1994 | Gotoh et al. | 320/44 |
| 5,352,967 | 10/1994 | Nutz et al. | 320/20 |
| 5,365,453 | 11/1994 | Startup et al. | 340/636 |
| 5,370,668 | 12/1994 | Shelton et al. | 324/430 |
| 5,372,898 | 12/1994 | Atwater et al. | 429/90 |
| 5,387,871 | 2/1995 | Tsui | 324/434 |
| 5,394,089 | 2/1995 | Clegg | 324/427 |
| 5,457,377 | 10/1995 | Jonsson | 324/430 |

BATTERY CAPACITY MONITORING SYSTEM

BACKGROUND OF THE INVENTION

1. Field of the Invention

The present invention relates to a method of and apparatus for battery capacity monitoring, and more particularly to a method of and apparatus for battery capacity monitoring that is suitable for automatic and centralized monitoring of the capacity of battery strings in a telecommunications network.

2. Description of the Related Art

Traditional maintenance of battery strings in the telecommunications industry has focused on a series of routines mandating periodic measurements of battery parameters, such as cell voltage and specific gravity. It was thought that if batteries were physically maintained with proper water levels, visual inspections, and correct voltage and specific gravity readings, the batteries would provide the necessary capacity when needed. However, when forced on-line, batteries often failed or produced far less than stated capacity even if they were properly maintained. It is now well-settled that these types of measurements are not accurate predictors of battery capacity.

Another approach to testing battery capacity involves measuring the impedance or conductance of the batteries in the battery string. One device for measuring the impedance of batteries is the Biddle Bite™ manufactured by Avo International™. This device includes a low-frequency transmitter and connection cables. The transmitter provides a capacitively coupled AC current to the battery under test. A receiver unit is clamped around a battery intercell connector, and potential probes measure the AC voltage across the cell. Measuring circuitry reads the RMS current and voltage data and computes the impedance of the battery. These impedances may be manually recorded for trend analysis.

Another such device, the Midtronics™ Celltron™, performs conductance testing on individual batteries in a battery string. A pair of manually operated clamps enables the device to be attached to the terminals of the battery to be tested. The device then measures the conductance of the battery.

A third approach to battery capacity testing involves periodic, internal resistance and intercell connection resistance measurements for each cell in a battery string, and their comparison with both previous readings and the expected mean resistance level for the specific type of battery in question. The greater the internal resistance, the more likely the cell will provide proportionately less capacity than expected. While the relationship between internal resistance and reserve capacity is not a linear function, testing has proven that individual cells that are 25% above the internal resistance baseline values for a given string are in jeopardy of not providing their expected capacity. The resistance measurement is therefore not used as a direct indicator of capacity, but rather as a warning indicator that a cell has deteriorated to a level that may affect the operating integrity of the system. Any cells found to be 100% above the baseline are nearly certain to no longer have any capacity available for emergency service.

One device for measuring cell internal resistance is the Cellcorder™ from Albercorp™. A pair of electrical leads are connected across the battery terminals to be tested, and a third lead is connected across an intercell connector that connects the battery being tested to an adjacent battery. The device first measures the cell voltage, and then applies a load resistance across the cell being tested for several seconds, measuring the current through the cell. The device then calculates the cell's internal resistance. The device also measures the intercell resistance.

Each of these testing devices is capable of testing only one cell at a time, whether the test is for internal resistance, conductance, or impedance. To test a string of, for example, twelve cells, it is necessary to manually attach the device to each cell, perform the necessary readings and then to move on to the remaining cells. Manual testing of this type is prone to errors. It is also extremely difficult to use such manual testing to monitor perhaps thousands of cells which are in use in a telephone network at a given time.

Moreover, while these devices are equipped with the capability to upload the battery capacity data to another computer, since tests are conducted manually, these devices are not suitable for 1) generating automatic alarms when battery capacity falls below a threshold, or 2) centralized monitoring and control of battery capacity and testing schedules.

Other devices for measuring battery capacity are shown, for example, in U.S. Pat. Nos. 4,333,149; 4,937,528; 4,968, 942; 5,126,675; 5,281,919; and 3,808,522. None of these devices overcomes the shortcomings of the aforementioned testing devices.

U.S. Pat. No. 4,590,430 relates to an apparatus that enables capacity testing to be performed on a string of batteries. The batteries are discharged at a constant rate. During the discharge, a sequencer sequentially measures the voltage of each battery. When the voltage across a battery falls below a threshold, the test is stopped while a technician manually removes the discharged battery from the circuit, reconnects the remaining cells, and sets a switch to apply a permanent voltage above the threshold to the sequencer during selection of the removed cell. The test is then restarted for the remaining cells.

This system has several shortcomings. First, testing is performed manually, with a technician removing the cells as they are discharged. This prevents the system from being used for automated testing under central control. Second, since the cells are discharged during testing, the batteries cannot reliably be tested while on-line, for example, while attached to telecommunications equipment in a stand-by mode ready to deliver power on demand. Finally, the system does not include a facility to enable it to centrally monitor battery capacity data for a number of battery strings, or to enable centralized scheduling of battery testing.

Accordingly, it is an object of the present invention to provide a method of and apparatus for monitoring the capacity of an entire string of batteries without manual intervention. It is a further object to provide a centralized monitoring system for battery capacity suitable for use in a telecommunications or other network that utilizes large numbers of batteries for primary or backup power. It is a still further object of the invention to provide an automated system for conducting capacity tests on the batteries in such a network.

SUMMARY OF THE INVENTION

The present invention is a system for monitoring, preferably centrally, the capacity of the batteries in at least one battery string. Electrical leads are connected to each battery terminal of the battery string. Associated with each battery string is a capacity testing means that includes:

i) means for switching between the electrical leads for sequentially selecting the leads associated with the terminals of each battery;

ii) means for measuring the internal resistance of the battery associated with each selected pair of electrical leads;

iii) means for comparing the internal resistance of each battery cell to an internal resistance threshold; and iv) means for triggering an alarm condition when the internal resistance of a battery exceeds the internal resistance threshold.

The means for measuring the internal resistance of each battery preferably includes a voltmeter connected between the selected terminals of a selected battery, a current testing circuit for applying a load resistance across the selected battery while measuring the current through the battery, and means for calculating the internal resistance of the battery from this voltage and current.

A microprocessor stores the internal resistance threshold. If desired, the system may perform intercell resistance testing. In such an embodiment, the system further comprises:

i) means for sequentially selecting the connected terminals of adjacent batteries;

ii) means for measuring the intercell resistance between the adjacent batteries;

iii) means for comparing the intercell resistance to an intercell resistance threshold; and iv) means for triggering an alarm condition when the intercell resistance exceeds the threshold.

A central monitoring station preferably monitors the capacity testing of many battery strings and:

receives battery capacity data and alarm signal from each capacity testing means;

schedules battery capacity testing;

transmits control commands to each capacity testing means for scheduling testing, initializing upload of capacity data, and requesting status information;

provides battery capacity data analysis, including trending; and uploads information to a network management computer.

A method of the invention involves the steps of:

a) semi-permanently attaching electrical leads to the terminals of the batteries of a battery string;

b) sequentially switching between the pairs of electrical leads connected each battery;

c) measuring the internal resistance of each battery as that battery is selected;

d) comparing the internal resistance of each battery to an internal resistance threshold; and e) triggering an alarm condition when the internal resistance of a battery exceeds the internal resistance threshold.

One embodiment of the invention relates to a system for centrally monitoring the capacity of at least one battery in at least one remote site, preferably an external telecommunications housing. This system comprises:

a central monitoring station; and capacity testing means located at each remote location for testing the capacity of the batteries. The capacity testing means transmits an alarm condition to the central station when the internal resistance of the battery exceeds an internal resistance threshold.

The capacity testing means preferably also comprises:

means for determining an alarm condition selected from the group consisting of high/low cell voltage, high/low string voltage, high current high/low temperature, and thermal runaway, and for transmitting the alarm condition to the central station.

The means for transmitting the alarm signal to the central station is preferably either an overhead channel in the housing, a telecommunications channel passing through the housing, or a cellular telephone connection.

DESCRIPTION OF THE PREFERRED EMBODIMENT

The present invention is a method of and apparatus for providing centralized monitoring of the battery capacity of the batteries and battery strings normally used in telecommunication networks. More broadly, the invention may be used in any application in which it is desirable to remotely or centrally monitor the capacity of batteries and battery strings. As used herein, the terms "battery" or "cell" will connote a DC voltage source of any type known to those skilled in the art.

The telecommunications industry generally utilizes strings of batteries, i.e., groups of batteries attached in series or parallel, to supply DC power to telecommunications equipment. For example, in a typical telecommunications application, twenty-four batteries, each having a terminal voltage of about two volts, would be connected in series to form a battery string having a terminal to terminal voltage of approximately 48 volts. This battery string could then be attached to the telecommunications system to provide primary or backup power to telecommunications equipment.

In an alternative application, the system may be used to monitor the battery strings that reside in exterior telecommunication enclosures. These battery strings typically use four 12-volt batteries that provide up to 125 amp/hour. The system would test for various anomalies that affect the batteries, and provide dry contact alarm closures that are connected to the alarm system of the telecommunications provider. In such an application, it is desirable that the system be totally automated and require no manual intervention after being installed and initialized.

The particular voltages discussed are provided by way of example only, it being understood that depending upon the particular telecommunications or other application, the batteries or battery strings may have different terminal voltages, a different number of batteries may be connected in a string, the batteries in a string may be connected in parallel, etc.

Figure 1:
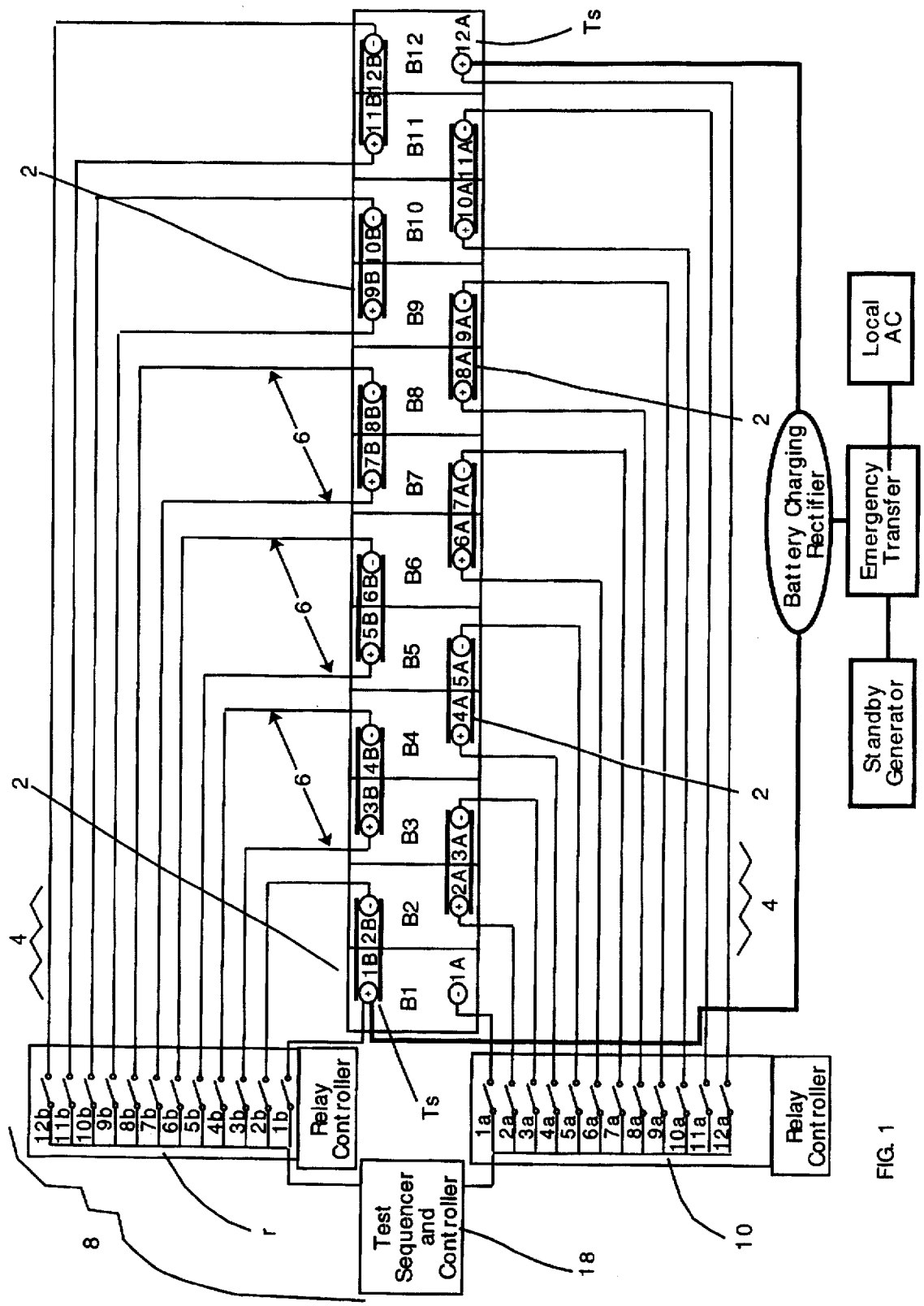
FIG. 1 is a circuit diagram showing a battery string and circuitry for selecting batteries of the string to test.
Figure 2:
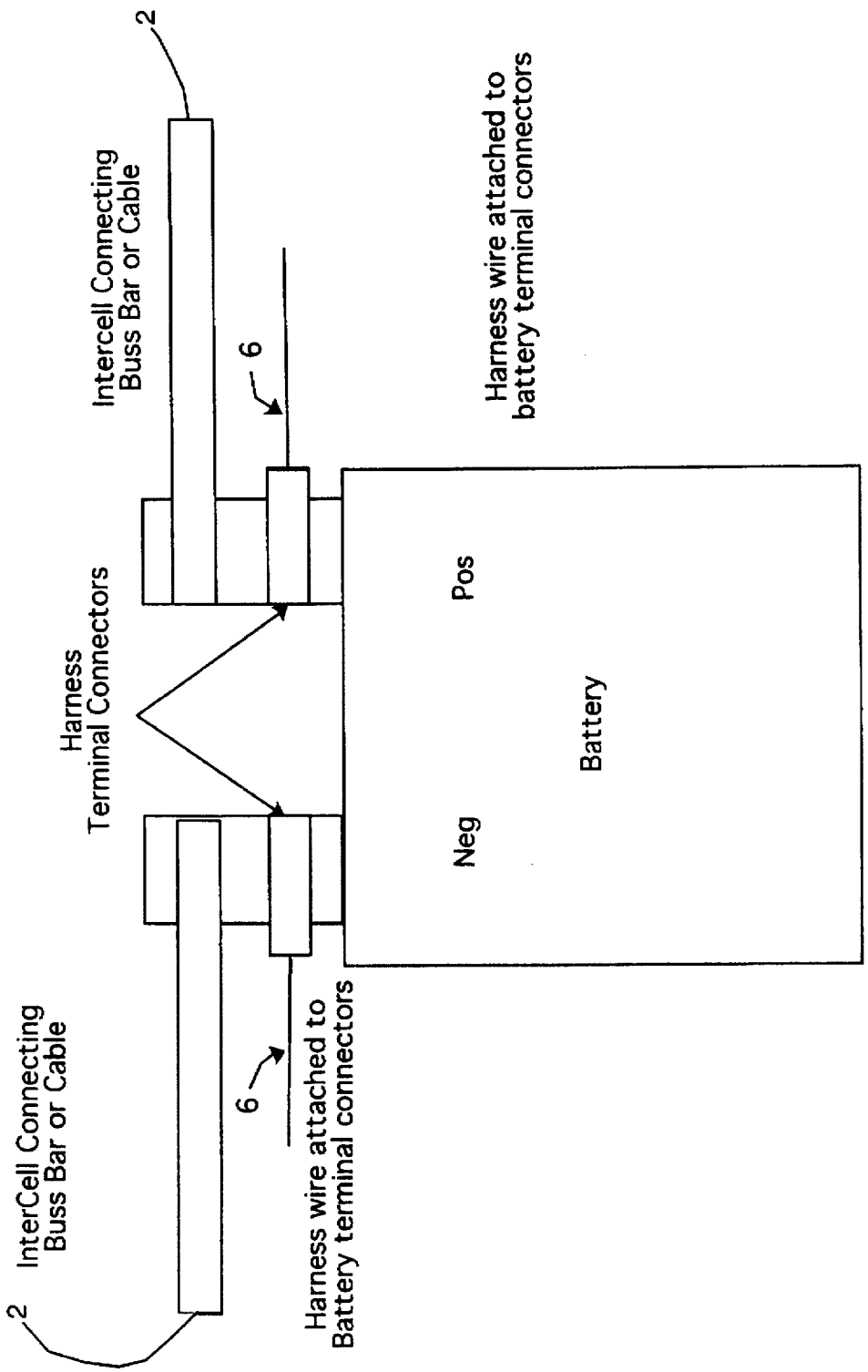
FIG. 2 is a schematic of an individual battery in a battery string.
Figure 4:
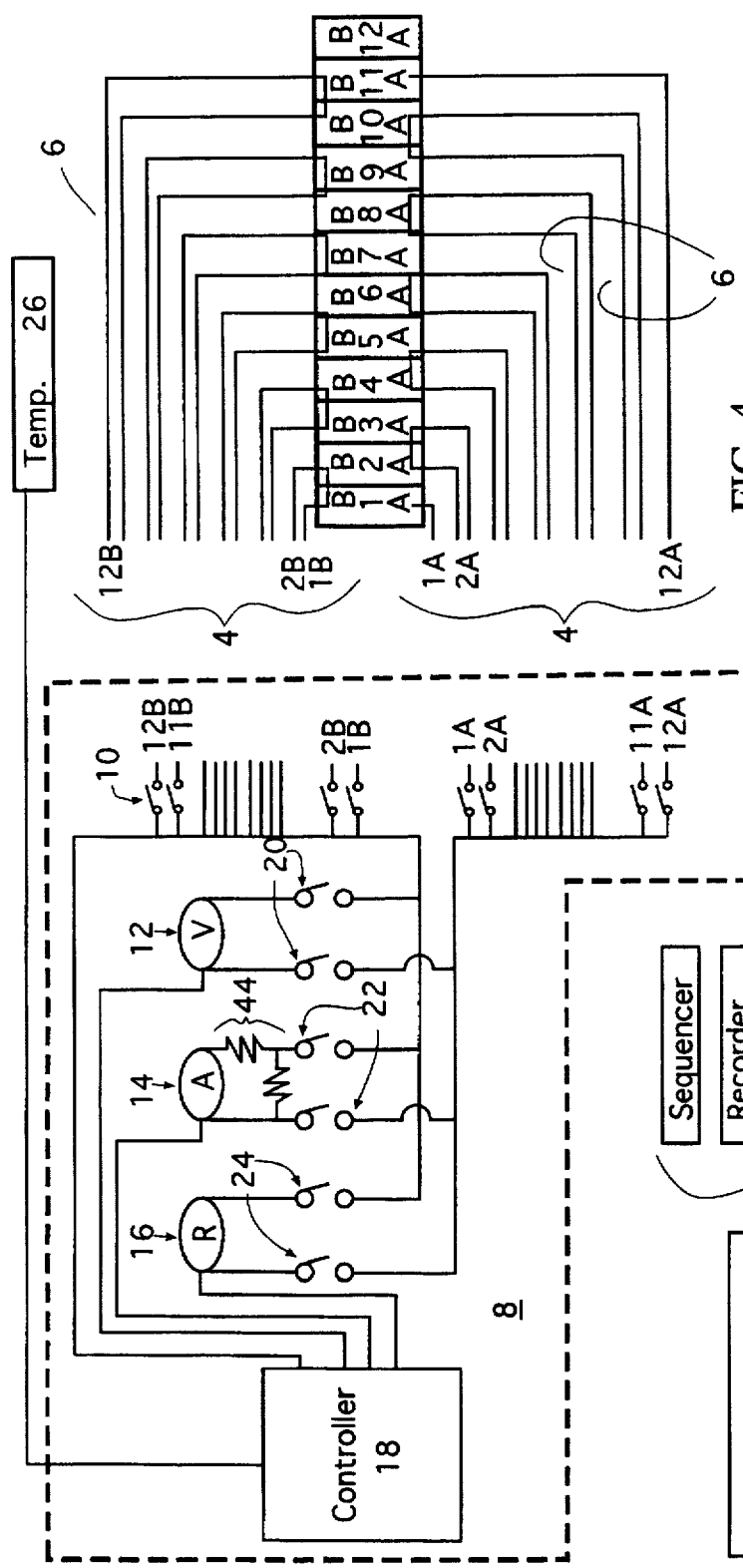
FIG. 4 is a schematic of the BCP Test Unit of the invention.

FIGS. 1 and 4 show a battery string in which the individual cells are designated $B_1 \ldots B_n$. The cells are connected in series so that the voltage of the battery string across terminals $T_s$ equals the sum of the voltages of the individual cells $B_1 \ldots B_n$. An electrically conducting strap or Buss Bar 2 is used to connect each adjacent pair of batteries. FIG. 2 shows an exploded view of an individual battery in the string.

A wire harness 4 electrically connects the battery string to a Battery Capacity Predictor Test Unit ("BCP Test Unit") 8. As shown in FIG. 2, the wire harness 4 includes a dedicated electrical connection 6 to each battery terminal within the string. For a typical 24 cell string of batteries, harness 4 will include at least 48 wires, one to each terminal of the battery string. The connections of the leads 6 to the battery terminals may be made by any conventional means, including clamps. The type of connection made by lead 6 to the battery terminals may depend on the type of intercell strap 2 which is in use, i.e., Buss Bar, cable, etc.

Harness 4 is connected by means of a conventional multi-wire electrical connector to BCP Test Unit ("BCP") 8. Because the harness 4 is attached to each battery lead in the string, the present invention can be used to monitor not only the internal resistance of each cell in the string, but the intercell resistance, i.e., the combined resistance of the strap and the junctions between the strap and the terminals of the cells between which the strap extends, as well.

As shown in detail in FIGS. 1 and 4, the BCP Test Unit 8 employs a group of relays 10 that are controlled by microprocessor based controller 18, with each individual lead that connects the BCP Test Unit 8 to the battery string being attached to an associated relay 10. Controller 18 generates control signals for the relays 10 to selectively connect two of the lines 6 to a testing network consisting of a voltmeter 12, an ammeter 14, and an ohmmeter 16. In an embodiment of the invention in which twelve batteries are used in the battery string, relay network 10 will consist of 24 relays, one for each battery terminal. Each relay is preferably a conventional contact closure relay, although solid state relays or and any other conventionally known method of selecting the leads to connect to the testing network may be used, if desired.

Figure 3:
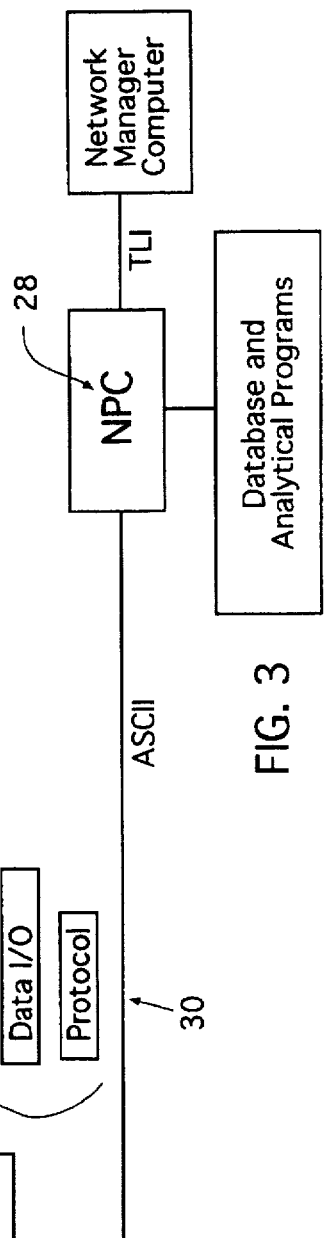
FIG. 3 is a block diagram of the battery capacity monitoring system of the invention.

Controller 18 incorporates a conventional microprocessor and provides a number of functions, as shown in FIG. 3, including controlling the timing and sequencing of operation of relay network 10, voltmeter 12, ammeter 14, and ohmmeter 16, and calculating storing the following information for the battery string: 1) The voltage across the terminals of each cell; 2) the current flowing through the cell under a predetermined load; and 3) the intercell resistance, i.e., the resistance between adjacent batteries through the intercell strap 2.

The operation of BCP Test Unit 8 will now be described with respect to testing batteries B1 and B2 of the battery string shown in FIGS. 1 and 4, where battery B1 is connected to BCP Test Unit 8 by means of leads 1A and 1B, and where battery B2 is connected to BCP Test Unit 8 by means of leads 2A and 2B. Controller 18 actuates the pair of relays in relay network 10 that correspond to the connections for lines 1A and 1B. Controller 18 also actuates one or more switches or relays 20 connecting the terminals of battery B1, or more generally the outputs of the two active relays in relay network 10, in a circuit with voltmeter 12. Voltmeter 12 is a conventional digital voltmeter that generates a digital value for the voltage across the terminals of battery B1, or an analog voltmeter used in conjunction with an A/D convertor. The digital voltage value is sent to controller 18 which stores the voltage data on any conventional data storage means, preferably in RAM or on a magnetic disk or tape 42.

Once the voltage reading is complete, switches 20 are opened by controller 18, which actuates one or more switches or relays 22 associated with ammeter 14 to connect the outputs of the relay network 10 in a circuit with ammeter 14. The ammeter circuit includes a resistor network 44 for applying a predetermined load across the terminals of battery B1. Ammeter 14 measures the current flowing between the terminals of battery B1. Voltmeter 12 is then actuated again to take a voltage reading across the selected battery with the resistive load in the circuit. The resistance that is applied across the battery terminals is predetermined based upon the particular battery type in use. A variable resistor may be used to enable the resistance to be set to correspond to a particular battery-type in use. Ammeter 14 may be a conventional digital ammeter that generates a digital signal representative of the current flowing between the terminals of battery B1, or an analog ohmmeter in conjunction an A/D convertor. The digital current value and voltage with the resistive load in the circuit are transmitted to controller 18 and stored. Controller 18 utilizes the voltage values with and without the resistive load, and the current value for battery B1 to compute the internal resistance of the battery using the well-known formula $R=\Delta V/I$. The internal resistance value for battery B1 is then stored.

Controller 18 then opens switches 22, removing ammeter 14 from the circuit with battery B1, and actuates relay network 10 for connecting terminals 1B and 2B to the testing network. Controller 18 then actuates one or more switches 24 for connecting the selected terminals in a circuit with ohmmeter 16. Ohmmeter 16 is a conventional ohmmeter that determines the intercell resistance between the connected terminals of batteries B1 and B2. Ohmmeter 16 generates a digital value of this resistance and transmits this information to controller 18 which stores it. As shown in FIG. 2, harness lines 6 are connected directly to the terminals of the batteries rather than to the straps 2. Otherwise, the intercell resistance would not include the resistance of the junction between the Buss Bar or strap 2 and the terminals of the batteries.

Once the voltage, current, internal resistance and intercell resistance have been calculated for Battery B1, controller 18 operates the relays in sequence to test each of the remaining batteries in the string in a like manner. Thus, controller 18 controls the sequencing and testing of the batteries and records voltage, current, internal resistance and intercell resistance data for the batteries.

Controller 18 also performs comparison functions on the battery data. For each battery in the string, or for each battery type, controller 18 is programmed with a baseline for the internal resistance of the battery. Each time the internal resistance of a battery is measured, this value is compared with the baseline by comparator module 44. If the battery resistance exceeds the baseline by a predetermined threshold, an alarm is generated by controller 18. In a preferred embodiment, the resistance of the battery must be at least 25% over the baseline resistance for the controller to generate an alarm. If new batteries are being used in a string, the controller 18 may be programmed with a baseline resistance for that type of battery. In the alternative, the controller may record the internal resistance of each battery at the time the BCP Test Unit 8 is attached to the battery string, and use this value as the baseline. The baseline and the software for controlling the various functions of the BCP Test Unit 8 are preferably stored in a ROM attached to the microprocessor of controller 18.

All of the testing discussed above may be done with the battery string on-line, i.e. attached to the telecommunications equipment as a backup power supply and prepared to deliver power on demand. It is possible to conduct the testing with the batteries delivering primary power, but this not desirable since testing necessarily places additional load on the battery string. In addition to the tests described above, the voltage across the entire battery string, i.e., the voltage between terminals 1A and 12B, may be measured in the same manner used to measure the voltage across an individual cell.

As shown in FIG. 3, a temperature sensor 26 may be provided adjacent to the battery string, or within the BCP Test Unit 8, if desired. Temperature sensor 26 is preferably a conventional digital thermometer which generates a digital signal representative of the ambient temperature. Since the capacity characteristics of each battery generally vary with temperature, the temperature values generated by temperature sensor 26 are preferably stored along with the capacity information for each cell in order that the system may compensate for temperature changes.

BCP Test Unit 8 is preferably located within the same power room as the battery string in order to reduce any interference or line loss through harness 4. While a power room may contain multiple strings of batteries, there will be preferably be a BCP Test Unit Test Unit 8 associated with each battery string. In the alternative, BCP test unit 8 may be modified so that it maybe connected to more than one harness, with the sequencing and recording functions modified so that the controller may take readings from each of the battery strings.

Figure 5:
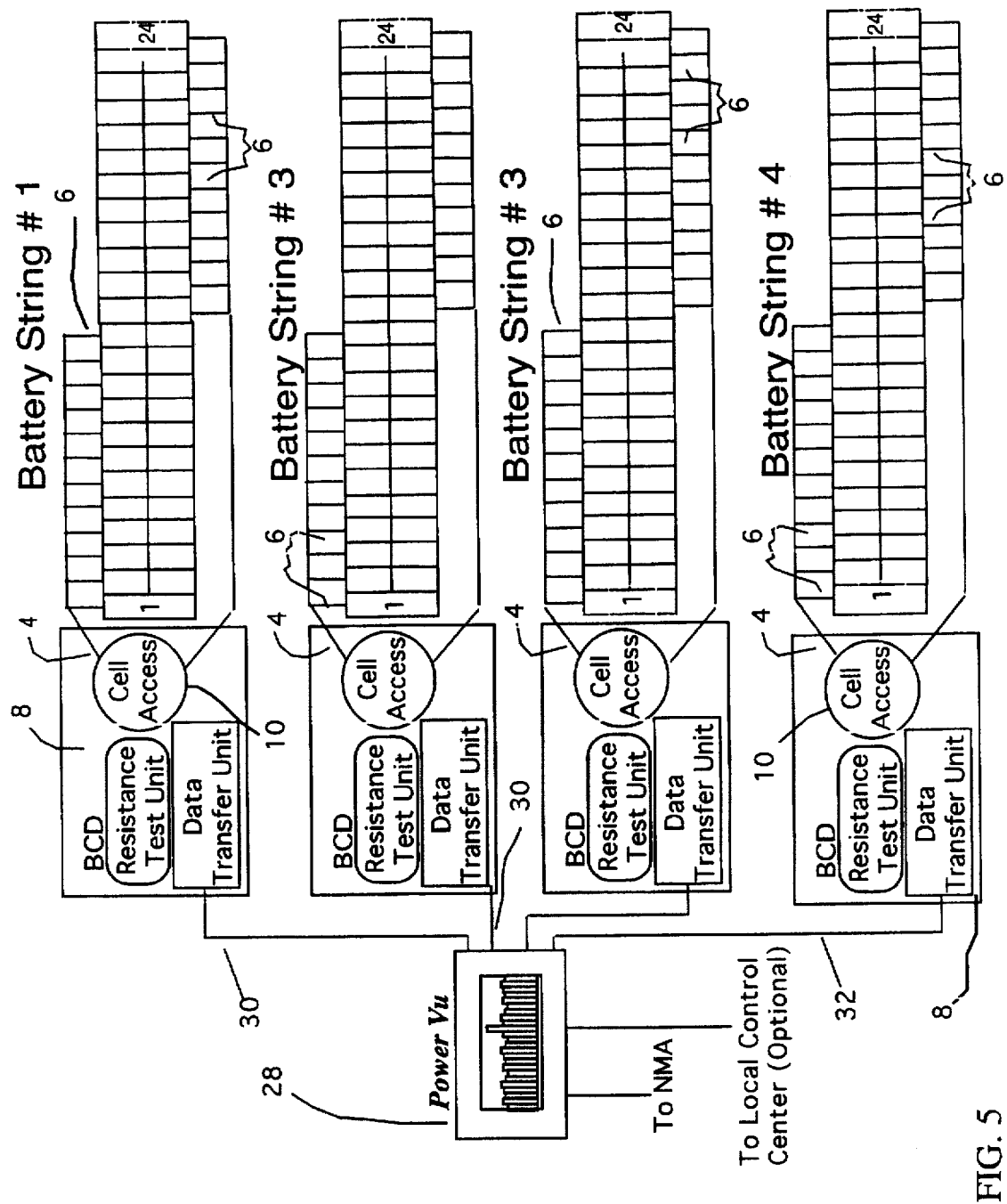
FIG. 5 is a schematic of the battery capacity monitoring system of the present invention.
Figure 6:
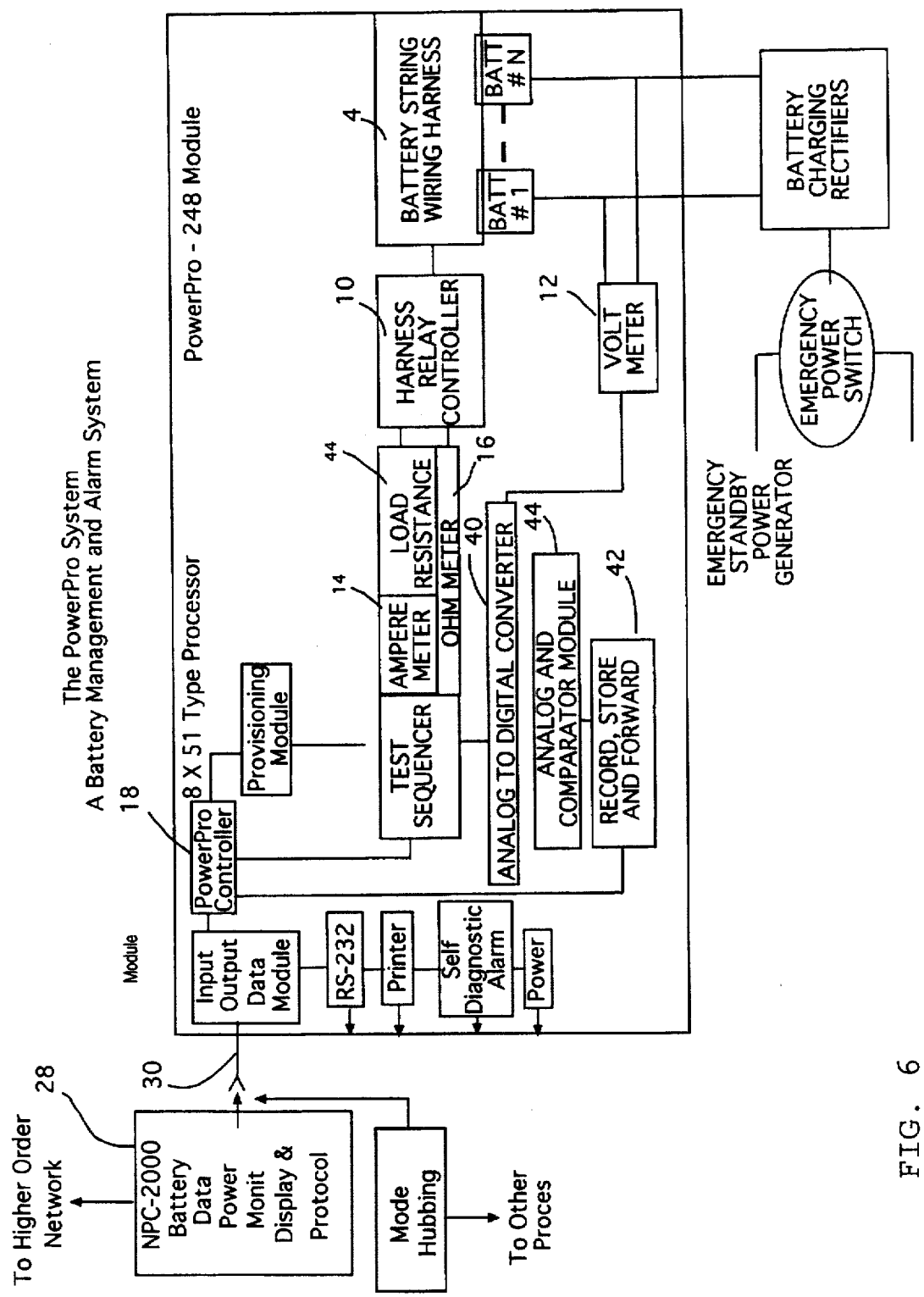
FIG. 6 is a block diagram of the battery capacity monitoring system of the present invention.

As shown in FIGS. 3, 5, and 6, each BCP Test Unit 8 is preferably connected by means of a dedicated transmission cable 30 to a Network Protocol Controller 28. The function Network Protocol Controller 28 is to receive the battery capacity data from a number of BCP Test Units 8, and to provide centralized monitoring of the battery strings associated with these BCP Test Units. Transmission cable 30 is preferably bi-directional and may be, for example, coaxial cable, fiber optic cable or any other appropriate transmission media. While BCP Test Unit 8 is preferably within the power room with the battery string that it tests, Network Protocol Controller 28 is preferably remote from the battery storage room and is connected to multiple remote BCP Test Units.

Figure 7:
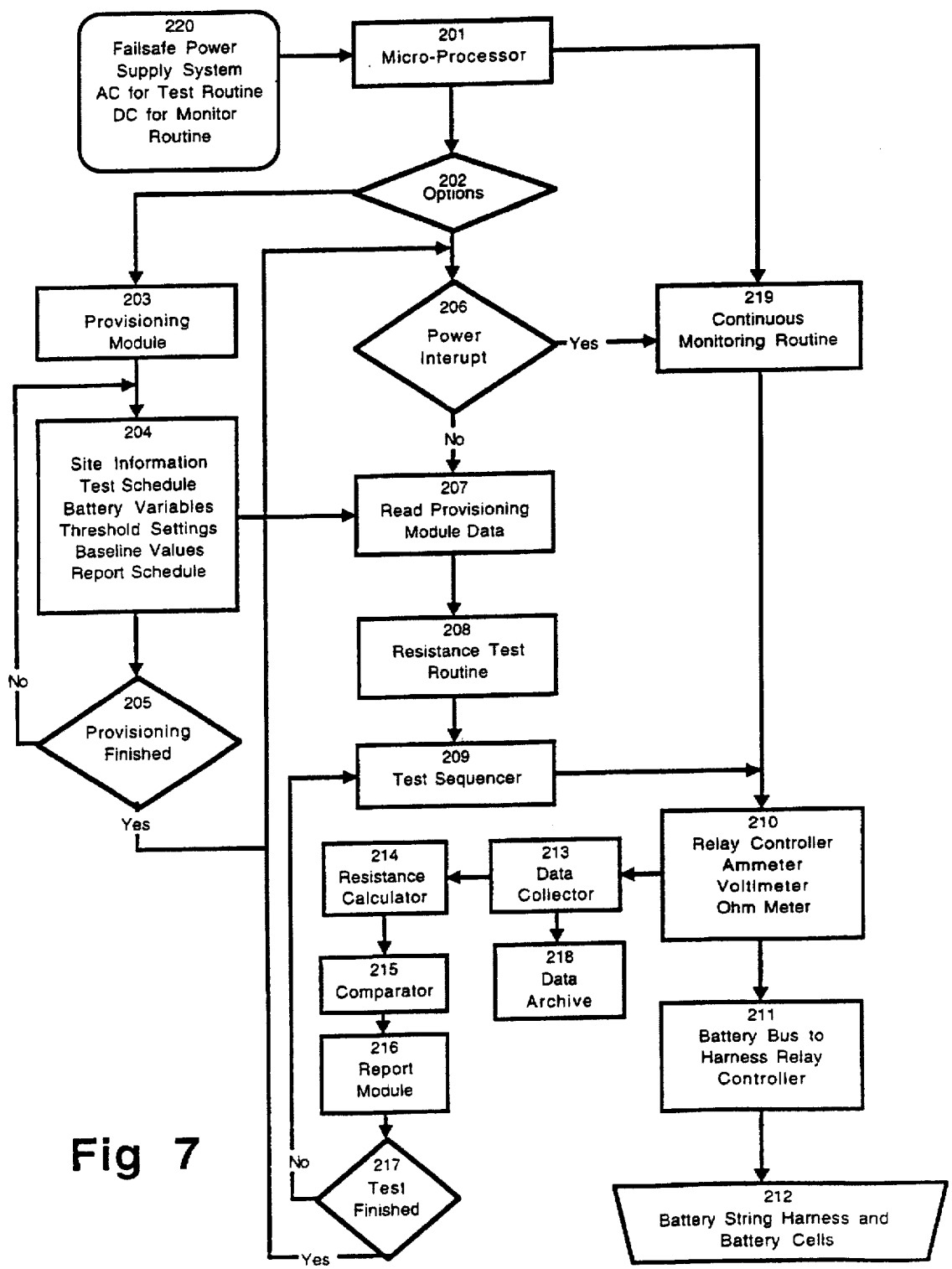
FIG. 7 is a flow chart showing the operation of the battery capacity testing system.

The operation of a BCP Test Unit will now be described with respect to the flow diagram shown in FIG. 7. Initially, the microprocessor that controls the systems goes through a set-up routine (201). All inputs to the microprocessor such as testing parameters, or test or status requests, are received via a keyboard, an RS-232 port attached to the microprocessor or by remote access through a modem or X.25. The preferred protocols for transmitting and receiving data are TL1, DCP or ASCII. Output from the microprocessor may be provided to an RS-232 port, a printer, or by any other known means to the Network Protocol Controller 28. During set-up (201), the microprocessor performs conventional set-up procedures to ensure that all systems are operating properly.

Testing is ordinarily performed using pre-programmed parameters. Under certain circumstances, the Network Protocol Controller 28 or a user will request special tests outside of those provisioned, or request that data stored in the data archive module be uploaded. In such an event, the options module (202) will transfer control to a provisioning module (203) to handle the request. The provisioning module controls the acceptance and validation of data to be inserted in the provisioning area (204). The provisioning module (204), (205) displays a menu for the type of provisioning to be inputted:

a—Site information (Location, tel. #s)
 b—Battery data (Type, model and date installed)
 c—Threshold Values (Baseline, intercell, and internal resistance, voltage and current levels)
 d—Variable Data e.g. regulation voltages
 e—Test schedule
 f—Report schedule Once provisioning is finished, control is transferred to the resistance test module (208).

At any time during operation of the system, if a power interrupt is detected (206), any resistance testing is cancelled, although voltage testing is still performed. Once AC power has been restored, and the battery string has been recharged, resistance testing is returned to scheduled testing.

Once resistance testing has begun (208), the test sequencer (209) activates a relay controller (210) that opens and closes the relays to switch the voltmeter, ohmmeter, and ammeter into and out of the testing circuit as required. A data collector (213) receives data from the relay controller for validation. The internal cell resistance is calculated (214) based on the voltage reading of the cell and the discharge current across the resistive load. The value calculated is passed on to a comparator module (215).

The comparator module (215) stores threshold values from the provisioning module for internal resistance, and intercell resistance. All test values and comparisons are preferably forwarded to the report module (216). The report module (216) stores the test data and uploads the data to the Network Protocol Controller 28 at the next scheduled upload time, as determined by the provisioning module.

If any comparison values are over or under threshold values or trend values then the report module automatically reports this alarm condition as programmed in the provisioning module, preferably by displaying the information, reporting the alarm condition to the Network Protocol Controller, and/or by generating a local audible/visual alarm signal.

All data measured and calculated are stored locally (218). This protects against reporting being interrupted and data being lost during upload. Monitoring of the battery/battery string voltage and current values is also done. This is important because the microprocessor operates under DC power taken from the batteries under surveillance. These voltage and current values, and any alarms associated therewith are reported upstream by the report module (216).

Figure 8:
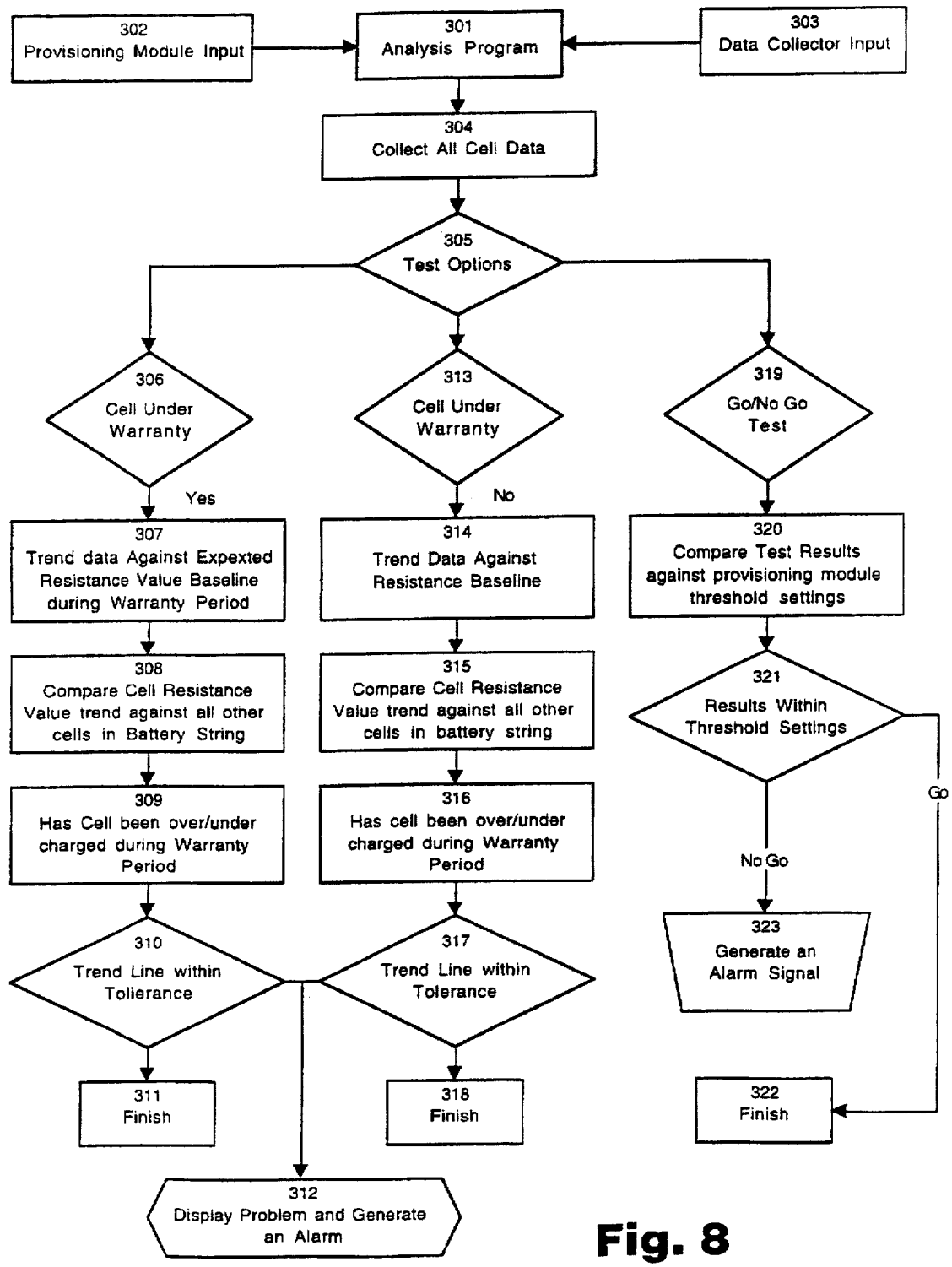
FIG. 8 is a flow diagram showing the operation of the battery capacity analysis routines of the invention.

A flow diagram of the analysis performed by the BCP Test Unit is shown in FIG. 8. It will be appreciated that certain aspects of this analysis could be performed by the Network Protocol Controller once the battery capacity data has been uploaded by the BCP Test Unit. An analysis program (301), once initiated either by new battery capacity data being generated, by local keyboard input or by command from the Network Protocol Controller, automatically runs various analysis routines. The analysis program (301) uses data stored in the provisioning module (302) (See FIG. 7) for determining scheduling of analysis and for obtaining data evaluation parameters. The analysis program (301) also uses the battery capacity data collected by data collector module (213).

The battery capacity data previously generated and stored for the cells/string are recalled from memory (304) for the analysis program. Depending upon the test options selected (305) the system can perform several layers of analysis. The system automatically checks the dates of cell installation to determine if the cells are under warranty. If the cell is out of warranty, then each cell is examined for its resistance value compared to the baseline and to the other cells in the string. If the provisioning module is set to request a GO/No Go comparison, then that routine only is run.

If the cell is under warranty, the trend analysis (307) consists of:

a—selecting the manufacturer's resistance baseline b—comparing the last resistance value against the baseline to verify the cell is within the limits specified in the provisioning module.

The next routine (308) trends individual cell resistance readings for allowable resistance increases within the warranty period relative to the expected life of the cell. The trend of the individual cells is then compared with the average of all cells in the string. Finally, the charging voltages of the cells and the battery string are tested for over voltage and under voltage charging conditions (309). If all measurements are with the tolerance specified in the provisioning module (310), the test is terminated. If the cell's resistance is outside the specified limits (312), then the system outputs an alarm message to the Network Protocol Controller via the communication media serial format in use, e.g., DCP, TL1 or ASCII, provides a local alarm display if desired, provides local audible and visual alarms, and provides relay contacts for audible and visual alarm indications to be connected to the local telephone power room or building alarm systems.

If the cell is not under warranty (313), the last readings of the cells resistance is trended with the baseline for the cells (314) and against all the cells in the battery string (315). Finally, the charging voltages of the cells and the battery string are tested for over voltage and under voltage charging conditions (317). If all measurements are with the tolerances specified in the provisioning module, this test is terminated (317), (318). Otherwise an alarm is generated.

The GO/No Go test module (319) can be run on a scheduled basis as specified in the provisioning module or whenever requested by local input or by the Network Protocol Controller. The internal cell resistance test data is compared with the baseline resistance stored in the provisioning module (320). If the resistance value is less than the threshold values specified in the provisioning module, the test is a "Go" and control is transferred to the report module (216). If the threshold value is exceeded, it is a "No Go," and an alarm is generated.

As discussed above, once an alarm is generated (312), an alarm relay is closed and several actions are taken:

1. A visual signal is provided locally along with an audible signal. A manual alarm cutoff button may be provided, if desired. The audible alarm can be programmed to stop after a predetermined period of time.
2. The relay closure triggers any other local alarm systems that exist in the power room/building. If no local alarm system exists, an alarm may be sent to a remote control center by means of a conventional telephone-based alarm system.
3. A page message may be sent to local maintenance personnel indicating the site and the type of battery problem.
4. The alarm may be sent to the Network Protocol Controller.

Network Protocol Controller 28 is preferably based upon a modified Macintosh™ platform which uses a Power PC™ 6100 microprocessor and the Macintosh™ version 7.5 operating system. This operating system will run either MS-DOS or Macintosh™ software. The Network Protocol Controller 28 preferably includes a local hard disk, a 3.5" diskette drive, and an Input/Output board configured to receive up to 64 inputs, thereby enabling the Network Protocol Controller to be connected to up to 64 BCP Test Units. It will be appreciated that the particular platform on which the Network Protocol Controller operates is not critical to the invention. It is foreseen that Network Protocol Controller is capable of operating on other types of platforms, provided that the platform were configured to perform the functions described herein.

It is generally necessary to test a battery string only at relatively lengthy predetermined intervals, usually no less than every week. Network Protocol Controller 28 monitors these intervals and determines when the interval has expired so that a capacity test should be conducted on a particular string. Network Protocol Controller 28 sends a signal via transmission cable 30 to the BCP Test Unit 8 associated with the battery string to be tested signalling that BCP Test Unit to perform the capacity tests discussed above. Controller 18 receives the initiation signal from Network Protocol Controller 28, and performs the capacity tests. Once the tests have been completed, controller 18 signals Network Protocol Controller 28 that the testing has been completed via transmission cable 30. When Network Protocol Controller 28 is prepared to receive the test data, a data transfer initiation signal is sent to controller 18, which then uploads the test data via transmission cable 30. The control signals between controller 18 and network protocol controller 28 are preferably sent in conventional serial format.

While testing of the battery strings is performed at relatively lengthy intervals, Network Protocol Controller 28 and each BCP test unit 8 may be in relatively constant communication, if desired. Preferably every few seconds, Network Protocol Controller 28 sends a signal to each BCP Test Unit 8 looking for any change in the status of that Test Unit. In the alternative, controller 18 may simply send out a status signal every few seconds, with the Network Protocol Controller 28 generating an alarm in the event of an interruption or change in the status signal. The alarm will preferably notify a technician that a problem exists with the BCP test unit 8 or with the transmission cable 30.

Network protocol controller 28 includes menu-driven software that performs the following functions:

1. Scheduling tests by BCP test units and monitoring the status of BCP test units;
2. Providing a menu driven interface to multiple BCP Test Units which may be local or remote;
3. Providing a graphical user interface for data display. Menu driven displays show data on the strings in graphical format;
4. Providing displays for out of tolerance and alarm conditions;
5. Providing displays of automated test results from battery strings via the BCP Test Units;
6. Providing access to manually intervene and control BCP Test Units;
7. Providing archiving, viewing, and comparing data received from the BCP Test Units for long term trending and other data analysis. The Network Protocol Controller is also capable of graphically displaying trend results, for example, 1) voltage as bar graphs; 2) internal resistance; and 3) intercell resistance;
8. Providing serial protocol conversion and interface to upstream systems. Network protocol controller 28 can upload the data on the different battery strings to telecommunications network managers using different data protocols, i.e., the TL1 protocol for NMA, SONET, etc. Network protocol controller 28 also provides data output to printers and other output devices.

Figure 9:
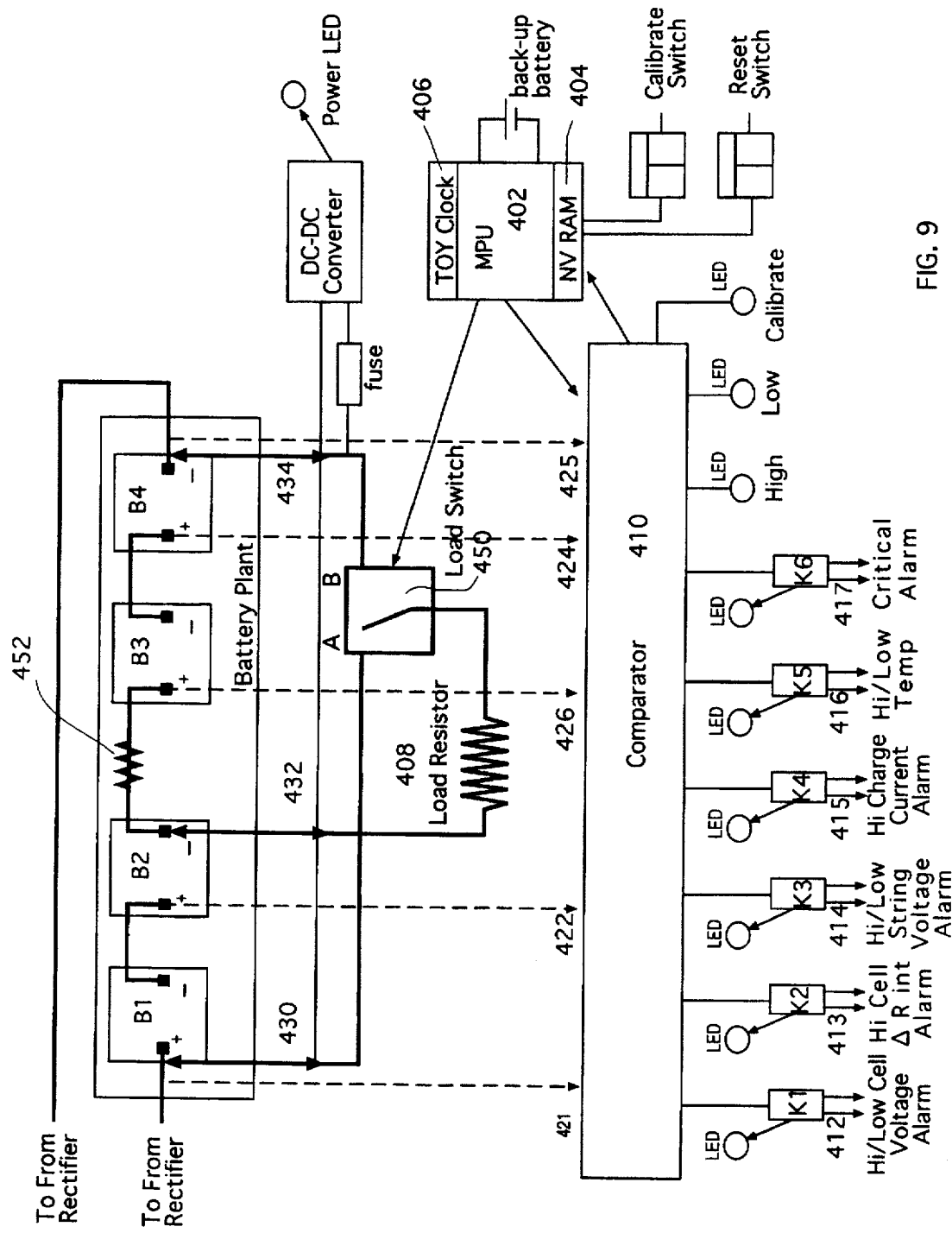
FIG. 9 is a schematic of an alternative embodiment of the battery capacity testing system of the invention.
Figure 10:
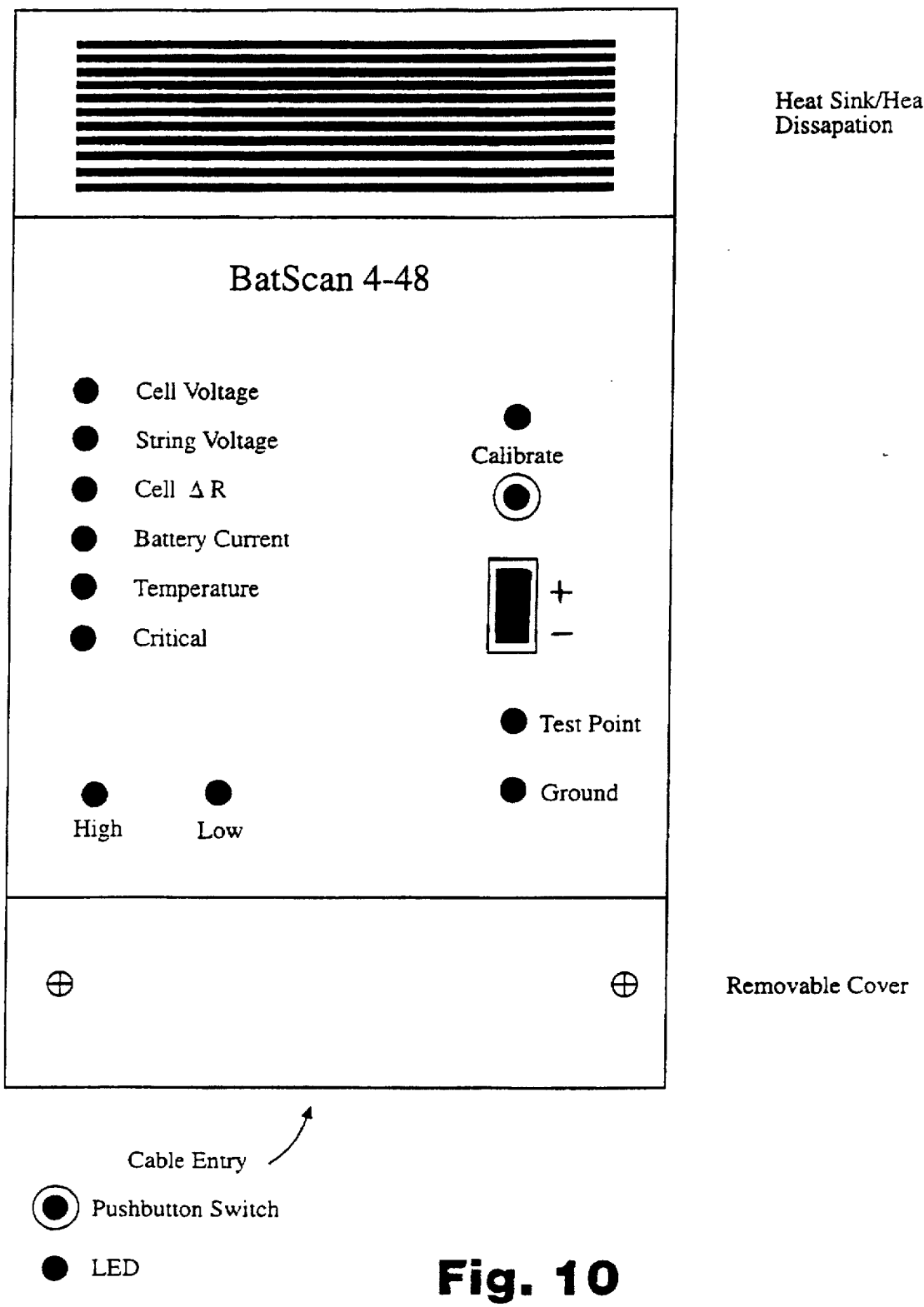
FIG. 10 is a front view of an alternative embodiment of the battery capacity testing system of the invention.

An alternative embodiment of the invention is shown in FIGS. 9 and 10. This embodiment of the invention is designed to monitor the battery strings located in exterior telecommunication enclosures. These strings typically use four 12-volt batteries. As shown in FIG. 10, the device is contained in a weather resistant housing that includes six alarm LED's and associated alarm contacts (not shown) which indicate out of threshold readings for individual cell $\Delta R_{int}$, individual cell high/low voltage, high/low string voltage, high current, high temperature, thermal runaway, and critical alarm.

Load connections 430, 432, and 434 for determining cell internal resistance preferably consist of teflon-coated 6 AWG stranded cable. Physical connections to the batteries are preferably by means of screw-down washer type connections that fits under the battery posts. Connections 430 and 434 are preferably made to the negative and positive sides of the battery string and connection 432 is made to the center of the string. Center lead 432 is preferably attached to load resistor 408 with leads 430 and 434 connected to an A-B switch 450. In the configuration shown, calculations of intercell resistance cannot be made between batteries B1 and B2, and batteries B3 and B4. It will be appreciated that this embodiment of the invention could be readily modified to enable intercell resistance calculations to be made for any adjacent pair of cells.

A voltage comparison test is preferably performed nearly constantly. The microprocessor 410 selects pairs of leads 421-425 as inputs for connection to the comparator 410, preferably in the following order: Leads 421 and 422, leads 422 and 423, leads 423 and 424, and leads 424 and 425. Comparator 410 measures the voltage across each set of leads and transmits this information to microprocessor 402. Overall string voltage is calculated by selecting leads 421 and 425 as inputs to the comparator. Leads 421-425 preferably consist of teflon-coated 20 AWG stranded cable. When any voltage exceeds a threshold stored in non-volatile RAM ("NVRAM") 404, the HI/Low Voltage alarm (Cell or String) relay will be tripped and an LED on the housing will illuminate. For a four battery, 48-volt string, the following voltage thresholds are preferred:

| Measurement Type | Low Range | Hi Range |
| --- | --- | --- |
| Cell | 10–12 volts | 14–16 volts |
| String | 42–48 volts | 56–62 volts |

Cell $\Delta R$ measurements are used to provide a change of internal resistance alarm which indicates a loss of battery capacity. Upon installation of the unit, the microprocessor 402 preferably performs a load resistance measurement on battery pairs B1–B2 and B3–B4 and stores these readings in NVRAM 404. The NVRAM is programmed, by means of a programming display or variable type switches, with a $\Delta R$ threshold, which is preferably the percentage of variation from the original reading needed to trigger an alarm, typically 25%. The amount of time between tests may also be set by means of the programming display or DIP switches.

The $\Delta R$ measurement is preferably accomplished by placing a resistive load 408 across two batteries for approximately three seconds. Just prior to removing the load, the current and voltage are read for the two cells under test. Just after removal of the load, the voltage across each cell is again read. The internal resistance of the pairs of cells is calculated using the standard equation $R = \Delta V/I$. This reading is then compared to the reading stored in NVRAM 404, and an alarm is triggered if the reading has increased by more than the threshold percentage. It will be appreciated that a change in absolute cell resistance above a certain threshold can be used to trigger the alarm rather than utilizing a percentage change.

The time interval for conducting the internal resistance test will be based upon customer requirements and may be changed using the aforementioned menu display. Since internal resistance changes relatively slowly, monthly testing is generally sufficient.

The DC current through the battery string is also preferably monitored. The purpose of this test is to provide an over current alarm and to disable the $\Delta R$ test when the batteries are charging or discharging. The current will be measured by using a battery strap as a shunt or by using a very small resistor as a shunt 452. The voltage across the shunt is measured by a voltmeter, and the current through the battery string is calculated in the conventional manner. On initial setup of the system, a threshold current will be stored in the NVRAM. If, during periodic testing of the current through the battery string a current level significantly above or below the threshold level were detected, the over current alarm would be activated.

During a charge or discharge of the battery plant the $\Delta R$ test is preferably disabled. Any current value, charge or discharge, above a threshold level, preferably 1 amp, will disable resistance testing.

A lithium-type battery preferably provides backup power to clock 406 in the event of primary power failure. Normally, the system is powered by either 48 Volts DC or the 120 Volt AC supply that is used to charge the battery string in the exterior telecommunications enclosure. All testing functions, except for voltage and current monitoring, are preferably discontinued during loss of primary power. The system will continue to generate alarms for low/high voltage in the event of a power failure.

Conventional temperature sensors are preferably used in the system. A temperature sensor monitors the temperature within the housing. If the temperature measured becomes too high or too low, or becomes critically high or low, and alarm will be triggered. The system also tests for thermal runaway which occurs when the difference between the battery temperature and the ambient temperature increases over time. The system determines the conditions and causes of thermal runaway before thermal runaway occurs, thereby preventing the batteries from having to endure over temperature and over charge conditions. The system preferably tests for two different scenarios associated with thermal runaway:

1) Battery temperature rising causes an overcharge condition. Testing to avoid this condition consists of determining if high current, high temperature and over voltage conditions exist; and 2) A shorted battery cell. This condition would be indicated by a low cell voltage for the shorted cell, a high cell voltage for the other cells, and high current.

A critical alarm will be activated in the event that any two alarms are triggered concurrently, or if certain measured parameters exceed critical values. The values shown in the table below are calibrated values that are preferably set by means of a display menu and stored in NVRAM 404 when the system is initiated. Default values for some or all of these values may be provided, if desired.

| Type | Alarm High | Alarm Low | Critical High | Critical Low | Actual |
|---|---|---|---|---|---|
| Cell(s) Voltage | * | * | * | * | |
| String Voltage | * | * | * | * | |
| ΔR | * | | * | | |
| Current | * | | * | | * |
| Temp | * | * | * | * | * |
| Thermal Runaway | * | * | | | |
| Thermal Runaway Time | | | | | * |

Once an alarm has been generated, it is transmitted to a central monitoring system, preferably located at a telecommunications central station. A typical exterior telecommunications cabinet includes an overhead channel for carrying alarm information. The alarm may be transmitted using this channel. Optionally, the alarm signal could be modulated onto a T1 or other telecommunications line passing through the cabinet, or may be transmitted by cellular telephone or the like. Microprocessor 402 includes the necessary capabilities for transmitting the alarm signal using the desired communications media.

Although the present invention has been described in detail with respect to certain embodiments and examples, variations and modifications exist which are within the scope of the present invention as defined in the following claims.

We claim:

1. A system for monitoring the capacity of the batteries in at least one battery string, each battery comprising a pair of terminals, each battery string comprising connecting straps connecting adjacent batteries of the string, the monitoring system comprising:
   a plurality of electrical leads, each lead being associated with and electrically connected to a battery terminal of the battery string; and
   capacity testing means associated with each battery string for testing the capacity of each battery in the associated battery string, each capacity testing means comprising:
   i) means for switching between the electrical leads for sequentially selecting the pair of electrical leads associated with the terminals of each battery;
   ii) means for measuring the internal resistance of the battery associated with each selected pair of electrical leads, said means comprising:
      a voltmeter connected between the selected pair of electrical leads for determining the voltage across the terminals of the battery associated with the leads;
      a current testing circuit for applying a load resistance across the selected terminals and for measuring the current between the selected terminals under the load resistance; and
      means for calculating the internal resistance of the selected battery from the voltage across the selected terminals and the current between the selected terminals;
   iii) means for comparing the internal resistance of each battery cell to an internal resistance threshold; and
   iv) means for triggering an alarm condition when the internal resistance of a battery exceeds the limits of the internal resistance threshold.

2. The battery capacity monitoring system according to claim 1 further comprising a microprocessor comprising a memory for storing the internal resistance threshold, the microprocessor comparing the internal resistance of each selected battery to the internal resistance threshold and triggering the alarm condition when the internal resistance of a battery exceeds the internal resistance threshold.

3. The battery capacity monitoring system according to claim 1 further comprising a resistance testing circuit which comprises:
   i) means for switching between the electrical leads for sequentially selecting the pairs of leads associated with the connected terminals of adjacent batteries;
   ii) means for measuring the intercell resistance between the selected adjacent batteries;
   iii) means for comparing the intercell resistance to an intercell resistance threshold; and
   iv) means for triggering an alarm condition when the intercell resistance exceeds the threshold.

4. The battery capacity monitoring system according to claim 3 further comprising a microprocessor comprising a memory for storing the intercell resistance threshold, the microprocessor comparing the intercell resistance of each selected pair of adjacent batteries to the threshold and triggering the alarm condition when the intercell resistance exceeds the intercell resistance threshold.

5. The battery capacity monitoring system according to claim 1 further comprising a central monitoring system comprising data communication means for receiving battery capacity data from each capacity testing means and for transmitting control commands to each capacity testing means;
   each capacity testing means further comprising communication means for enabling data communications with the central monitoring system for enabling the transfer of data on the capacity of the batteries in the associated battery string to the central monitoring system and for receiving control commands from the central monitoring system.

6. The battery capacity monitoring system according to claim 5 wherein the central monitoring system comprises:
   data analysis means for analyzing the capacity data for each battery string;
   means for transmitting battery capacity information on the battery strings to a telecommunication network monitoring system.

7. The battery capacity monitoring system according to claim 5 wherein the communications means utilizes a serial communications protocol.

8. The battery capacity monitoring system according to claim 5 wherein the central monitoring system comprises:
   means for determining the operational status of each capacity testing means; and
   scheduling means for controlling each capacity testing means to perform a battery capacity test at a desired predetermined time or at desired time intervals.

9. The battery capacity monitoring system according to claim 8 wherein the central monitoring system comprises means for generating an alarm condition in response to the operational status of the capacity testing means.

10. The battery capacity monitoring system according to claim 1 wherein each capacity testing means comprises a scheduling system performing battery capacity testing at desired predetermined times or at desired time intervals.

11. The battery capacity monitoring system according to claim 1 further comprising:
   display means for displaying battery capacity data and alarm conditions;
   an interface for enabling user input of testing and scheduling criteria.

12. The battery capacity monitoring system according to claim 1 wherein the capacity testing means further comprises:

means for selecting the leads connected to the terminals representative of the voltage across the entire battery string; and means for measuring the voltage across the battery string.

13. The battery capacity measuring system according to claim 12 wherein the capacity testing means further comprises:

means for storing at least one high or low voltage threshold; and means for comparing the voltage across the battery string to the voltage threshold and for generating an alarm when the voltage across the battery string exceeds the high or low limit of the threshold.

14. The battery capacity monitoring system according to claim 1 wherein the capacity testing means further comprises:

means for measuring the current through the battery string;

means for storing a current threshold; and means for comparing the current through the battery string to the current threshold and for generating an alarm when the current through the battery string exceeds the current threshold.

15. A method of monitoring the capacity of the batteries in at least one battery string, each battery comprising a pair of terminals, each battery string comprising connecting straps connecting adjacent batteries of the string, the method comprising the steps of:

a) fixedly attaching electrical leads to the terminals of the batteries in the battery string whereby each battery terminal is in electrical contact with at least one electrical lead;

b) sequentially switching between the electrical leads for selecting the pair of electrical leads associated with the terminals of each battery;

c) measuring the internal resistance of each battery as that battery is selected;

d) comparing the internal resistance of each battery to an internal resistance threshold; and e) triggering an alarm condition when the internal resistance of a battery exceeds the internal resistance threshold.

16. The battery capacity monitoring method according to claim 15 wherein the step of measuring the internal resistance of each battery comprises:

measuring the voltage across the terminals of the battery associated with the selected leads;

applying a load resistance across the selected terminals and measuring the current between the selected terminals under the load resistance; and calculating the internal resistance from the measured voltage and current.

17. The battery capacity monitoring method according to claim 15 further comprising the steps of:

f) switching between the electrical leads for sequentially selecting the pairs of leads associated with the connected terminals of adjacent batteries;

g) measuring the intercell resistance between the adjacent batteries associated with each selected pair of electrical leads;

h) comparing the intercell resistance to an intercell resistance threshold; and i) triggering an alarm condition when the intercell resistance exceeds the threshold.

18. The battery capacity monitoring method according to claim 15 further comprising the steps of:

f) gathering battery capacity data on the battery string; and g) transmitting the battery capacity data to a central monitoring station.

19. The battery capacity monitoring method according to claim 15 further comprising the step of:

f) transmitting the alarm condition to a central monitoring station.

20. The battery capacity monitoring method according to claim 19 further comprising the steps of:

h) transmitting control signals from the central monitoring station for i) controlling the transmission of the battery capacity data to the central monitoring station, and ii) controlling the scheduling of battery string testing.

21. The battery capacity monitoring method according to claim 15 further comprising the steps of:

f) switching between the electrical leads for sequentially selecting the pairs of leads associated with the connected terminals of adjacent batteries;

g) measuring the intercell resistance between the adjacent batteries associated with each selected pair of electrical leads;

h) comparing the intercell resistance to an intercell resistance threshold;

i) triggering an alarm condition when the intercell resistance exceeds the threshold j) gathering battery capacity data on the battery string;

k) providing a central monitoring station and transmitting control signals from the central monitoring station for i) controlling the transmission of the battery capacity data to the central monitoring station, and ii) controlling the scheduling of battery string testing; and l) transmitting the alarm conditions to the central monitoring station.

22. The battery capacity monitoring method according to claim 18 wherein the central monitoring station analyzes the capacity data for each battery string; and transmits the battery capacity information to a telecommunication network monitoring system.

23. The battery capacity monitoring method according to claim 18 wherein the central monitoring station schedules battery capacity testing at predetermined times or intervals.

24. The battery capacity monitoring method according to claim 18 further comprising the steps of:

selecting the leads connected to the terminals representative of the voltage across the entire battery string; and measuring the voltage across the battery string.

25. The battery capacity monitoring method according to claim 24 further comprising the step of:

comparing the voltage across the battery string to a voltage threshold and generating an alarm when the voltage across the battery string exceeds a high or low limit of the threshold.

26. The battery capacity monitoring method according to claim 18 further comprising the steps of:

measuring the current through the battery string;

storing a current threshold; and comparing the current through the battery string to the current threshold and generating an alarm when the current through the battery string exceeds the current threshold.

27. A system for centrally monitoring the capacity of at least one battery in at least one remote location, each battery comprising a pair of terminals, the monitoring system comprising:

a central monitoring station; and capacity testing means located at each remote location for testing the capacity of the batteries at that remote location, each capacity testing means comprising:

i) means for switching between electrical leads connected to the battery terminals of the batteries at the remote location for sequentially selecting the pair of electrical leads associated with the terminals of each battery;

ii) means for measuring the internal resistance of the battery associated with each selected pair of electrical leads;

iii) means for comparing the internal resistance of each battery cell to an internal resistance threshold;

iv) means for triggering an alarm condition when the internal resistance of a battery exceeds a limit of the internal resistance threshold; and v) means for transmitting the alarm condition to the central station.

28. The central battery monitoring system according to claim 27 wherein the means for measuring the internal resistance of each battery comprises:

a voltmeter connected between the selected pair of electrical leads for determining the voltage across the terminals of the battery associated with the leads;

a current testing circuit for applying a load resistance across the selected terminals and for measuring the current between the selected terminals under the load resistance; and means for calculating the internal resistance of the battery associated with the selected leads from the voltage across the selected terminals and the current between the selected terminals.

29. The central battery monitoring system according to claim 27 wherein the capacity testing means further comprises:

vi) means for determining an alarm condition selected from the group consisting of high/low cell voltage, high/low string voltage, high current high/low temperature, and thermal runaway, and for transmitting the alarm condition to the central station.

30. The central battery monitoring system according to claim 27 wherein the capacity testing means further comprises:

vi) scheduling means for automatically conducting battery capacity testing at predetermined intervals.

31. The central battery monitoring system according to claim 27 wherein the remote location is an exterior telecommunications housing and the means for transmitting the alarm signal is selected from the group consisting of an overhead channel in the housing, a telecommunications channel passing through the housing, and cellular telephone means.

32. The central battery monitoring system according to claim 27 wherein the capacity testing means further comprises:

vi) means for detecting the causes and conditions indicative of thermal runaway, and for transmitting an alarm condition to the central station in response to the causes and conditions.

* * * * *